United States Patent
Mizuhara et al.

(10) Patent No.: US 7,476,969 B2
(45) Date of Patent: Jan. 13, 2009

(54) SEMICONDUCTOR PACKAGES FOR SURFACE MOUNTING AND METHOD OF PRODUCING SAME

(75) Inventors: Susumu Mizuhara, Kameoka (JP); Takamasa Kameda, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 11/482,287

(22) Filed: Jul. 6, 2006

(65) Prior Publication Data

US 2007/0045846 A1 Mar. 1, 2007

(30) Foreign Application Priority Data

Jul. 29, 2005 (JP) ............... 2005-220635

(51) Int. Cl.
*H01L 23/48* (2006.01)
*H01L 23/52* (2006.01)
*H01L 29/40* (2006.01)

(52) U.S. Cl. ............ 257/738; 257/724; 257/703; 257/778; 438/151; 438/126; 438/127

(58) Field of Classification Search ............ 257/738, 257/666–787; 362/249, 84, 255, 267, 293, 362/310; 438/151, 126, 127
See application file for complete search history.

(56) References Cited

U.S. PATENT DOCUMENTS 6,345,903 B1 * 2/2002 Koike et al. ............ 362/249

| 6,599,768 | B1 * | 7/2003 | Chen ............ 438/22 |
| 2003/0218245 | A1 | 11/2003 | Matsuzawa et al. |
| 2005/0151142 | A1 * | 7/2005 | Imai ............ 257/81 |
| 2005/0194670 | A1 * | 9/2005 | Kameyama et al. ......... 257/678 |
| 2006/0131730 | A1 * | 6/2006 | Nakamura ............ 257/700 |

FOREIGN PATENT DOCUMENTS

| CN | 1459855 | 3/2003 |
| JP | 11-067976 | 9/1999 |
| JP | 2002-118204 | 4/2002 |
| JP | 2002118204 A * | 4/2002 |
| JP | 2005-079129 | 3/2005 |
| JP | 2005-098763 | 4/2005 |
| JP | 2005098763 A * | 4/2005 |

* cited by examiner

*Primary Examiner*—M. Wilczewski
*Assistant Examiner*—Telly D Green
(74) *Attorney, Agent, or Firm*—Weaver Austin Villeneuve Sampson LLP

(57) ABSTRACT

A semiconductor package for surface mounting has a substrate having electrode patterns formed on both its surfaces which are electrically connected through passages such as throughholes formed through the substrate, all of these electrode patterns having a metal film formed by an electrolytic plating process. Semiconductor chips are wire-bonded onto one its surfaces (mounting surface) which is sealed with a resin layer. Lead-in wires each with one end exposed externally are included only those of the electrode patterns on the back surface of the substrate opposite its mounting surface such that the mounting surface has no lead-in wires with a part exposed externally.

12 Claims, 6 Drawing Sheets

(1) DIE BONDING (2) WIRE BONDING (3) RESIN SEALING (4) DICING (1) SOLDER PRINTING (2) COMPONENT MOUNTING (3) REFLOW

SEMICONDUCTOR PACKAGES FOR SURFACE MOUNTING AND METHOD OF PRODUCING SAME

Priority is based on Japanese Patent Application 2005-220635 filed Jul. 29, 2005.

BACKGROUND OF THE INVENTION

This invention relates to semiconductor packages containing a semiconductor chip to be surface-mounted and method of producing such semiconductor packages.

As an example of semiconductor package to be surface-mounted (hereinafter referred to simply as a semiconductor package or evenly more simply as a package), there have been known structures of the kind having an electrode pattern formed on each of both surfaces of a substrate, a semiconductor chip wire-bonded to one of the surfaces and this surface with the wire-bonded semiconductor chip sealed with a resin material.

In order to mass-produce semiconductor packages of this kind, a method has recently been known to initially prepare an assembly of a plurality of such packages and then separately cut off the individual packages. FIG. 8 shows an outline of such a method, according to which an assembly substrate 100 is initially prepared with a plurality of electrode patterns aligned, each corresponding to a package, and semiconductor chips 11 and 12 set on this assembly substrate 100 by die bonding (FIG. 8 (1)).

Next, each of the semiconductor chips 11 an 12 is wired-bonded (numerals 13 each indicating a wire for the bonding (referred to as the bonding wire) to the electrode pattern on the assembly substrate 1000 ((2) of FIG. 8) and a resin material 104 is applied thereon to seal them in ((3) of FIG. 8).

After an assembly of semiconductor packages is thus prepared, a dicing blade 105 is used to carry out the dicing process for cutting the assembly into separate packages 1 ((4) of FIG. 8).

The next processes for mounting the semiconductor package thus prepared onto a printed circuit board of a target device for the mounting are shown in FIG. 9. Firstly, as shown in (1) of FIG. 9, the process of printing a cream solder 201 on the electrodes (not shown) on the printed circuit board 200 is carried out, followed by the process of mounting the semiconductor packages 1 and other components 106 thereon as shown in (2) of FIG. 9. Thereafter, the circuit board 200 loaded with the components 1 and 106 is placed inside a reflow furnace and undergoes a heating process as shown in (3) of FIG. 9 such that the components inclusive of the semiconductor packages 1 come to be soldered onto the printed substrate 200.

Thus, semiconductor packages can be mounted to a printed circuit board by the same method as ordinary components, but since the substrate, the semiconductor chips and the resin have different thermal expansion coefficients, faulty conditions such as cracks in the resin may occur by the reflow, and the packages may end up by exploding in a worst situation, as reported in Japanese Patent Publication Tokkai 2000-124363.

Since a gold wire is usually used for the wire-bonding of semiconductor packages, furthermore, a gold plating process is carried out also on the electrode patterns on the circuit board in order to increase the strength of the wire bonding. It is also known that a film with a thickness appropriate for wire bonding can be obtained by an electrolytic gold plating process. Japanese Patent Publication Tokkai 2001-110940, for example, discloses that an improved contacting characteristic in wire bonding was observed by forming a nickel film on the electrode pattern on the substrate by electrolytic plating and then forming a gold film thereover.

For producing a semiconductor package assembly as described above, it is preferable to carry out an electrolytic gold plating process prior to the die bonding process as shown in (1) of FIG. 8. For this reason, it has been known to connect the electrode patterns in each area by means of a linear electrode (referred to as a lead-in wire) such that an electrolytic gold plating process can be carried out together at once.

FIG. 10 shows an example of structure of a single semiconductor package 1 produced by the production method illustrated by FIG. 8. This package 1 corresponds to just one of the pieces that have been separated by the dicing process, numeral 10 therein indicating an individually separated substrate portion (also referred to as an interposer), numerals 11, 12 and 13 again indicating semiconductor chips and bonding wires and numeral 14 indicating the sealing resin material, as in FIG. 8.

Numerals 15 each indicate an electrode pattern on the mounting surface of the semiconductor chip to which is continuously formed a lead-in wire 16 for electrolytic gold plating. Neighboring ones of these lead-in wires 16 were originally connected to each other on the assembly substrate 100 but are now as shown surrounded by circles of broken lines after the original assembly substrate 100 was sealed with resin and was subjected to the dicing process, being exposed at edge surfaces of the package 1 where they are sandwiched between the resin material 14 and the substrate 10.

Since these lead-in wires 16 for electrolytic gold plating are exposed on side surfaces between the resin 14 and the substrate 10, as described above, they are in a condition where water components from outside can easily taken in by the resin because the contacting condition between the gold plate layer and the resin is not favorable. This is why the probability of occurrence of faults such as cracks and explosion of packages as explained above tends to increase.

Examples of prior art method for preventing the hygroscopic property of a package from increasing include including an additive to the sealing resin to thereby adjust its thermal expansion rate and hydroscopic property. For applications where the transparency characteristic of the package needs to be maintained such as semiconductor packages for light emitter and receiver of an optical sensor (such as those incorporating a photo IC or a light-emitting diode), however, it is not an easy solution to use an additive because the additive may adversely affect the transparency characteristic of the resin.

On the other hand, electroless plating process may be considered instead of electrolytic plating such that lead-in wires for plating may be dispensed with. In order to obtain by electroless plating a metal film thick enough for providing sufficiently strong wire bonding, however, the plating process will have to be repeated many times and hence the process becomes troublesome.

SUMMARY OF THE INVENTION

It is therefore an object of this invention in view of the problem described above to produce semiconductor packages with electrolytic gold plating process effected to their electrode patterns by preventing the hygroscopic property of the packages from increasing by a method other than that of mixing an additive to the resin such that the electrolytic plating process necessary for obtaining enough strength for wire bonding can be carried out and the faults and destruction of the packages can be prevented.

A semiconductor package according to this invention is for surface mounting and may be characterized as comprising a substrate having a mounting surface and a back surface facing opposite to each other, electrode patterns being formed both on the mounting surface and on the back surface, semiconductor chips that are wire-bonded on the mounting surface and a resin layer that seals the mounting surface. The electrode patterns on the back surface, which is not sealed with resin and serves to be soldered to a printed circuit board, include lead-in wires for electrolytic plating but there are no such lead-in wires present on the mounting surface. The substrate is provided with passages through which the electrode patterns on the mounting surface and the back surface are electrically connected, and the electrode patterns on each of the mounting surface and the back surface have a metal film that is formed by an electrolytic plating process.

In the above, each of the lead-in wires may be characterized as having an externally exposed end part and may preferably be formed as a linear electrode pattern as shown at 16 in FIG. 10. In such a case, they may be formed as the assembly substrate is cut to be separated into individual packages by dicing, as explained above. The passages for electrically connecting the electrode patterns on both surfaces of the substrate may preferably formed as throughholes. The metal films are preferably formed as gold films but films with gold and another metal such as nickel may be feasible. Metals other than gold may also be acceptable as long as the strength of the wire bonding can be improved.

With a semiconductor package structured as above, the lead-in patterns for electrolytic plating are formed not on the surface where semiconductor chips are mounted and sealed in but on the opposite side and hence they do not end up being exposed to the exterior on an edge surface, sandwiched between the resin and the substrate. Thus, the increase in the hygroscopic property of the package can be prevented, and the probability of failures such as cracks and destruction can be reduced. When such a semiconductor package is mounted to a printed circuit board, these lead-in wires for electrolytic plating will come into contact with a surface of the printed circuit board. Since electrodes on the circuit board are formed only at places corresponding to electrode patterns required for connecting to semiconductor chips, there is no problem of a defective connection due to a lead-in wire for electrolytic plating as long as the package is mounted properly. Moreover, since metal films are formed by electrolytic plating over all electrode patterns on both surfaces, the strength of the wire bonding can be dependably maintained.

A semiconductor package according to a preferable embodiment has its mounting surface sealed with a layer of a transparent resin. Examples of such a semiconductor package include those incorporating semiconductor chips having a light-emitting or light-receiving property such as photo ICs and light-emitting diodes.

A method, according to this invention, of producing semiconductor packages for surface mounting is characterized as comprising sequentially carrying out the steps of (1) preparing a substrate having a mounting surface and a back surface facing opposite to each other, a plurality of areas corresponding to the size of the semiconductor packages set on the substrate, forming electrode patterns on the mounting surface such that the electrode patterns formed in different ones of the areas are electrically independent to each other, forming on the back surface electrode patterns and plating electrodes for electrolytic plating such that the plating electrodes electrically connect the electrode patterns in different areas, and forming in each of the areas passages through which the electrode patterns on the mounting surface and the back surface are electrically connected, (2) applying a specified voltage to the plating electrodes and thereby forming a metal film over the electrode patterns on both the mounting surface and the back surface by an electrolytic plating process, (3) thereafter placing and wire-bonding semiconductor chips onto the mounting surface, there being no plating electrodes formed on the mounting surface, (4) thereafter sealing the mounting surface with a resin, and (5) thereafter separating the substrates into the areas.

In the above, the first step (1) may be considered as the step of obtaining an assembly substrate (or a substrate which is essentially an assembly of a plurality of substrates each for a semiconductor package. The surface on this assembly substrate where electrode patterns are formed so as to be electrically independent between different areas corresponds to the mounting surface for mounting semiconductor chips, and its opposite surface on which electrodes for electrolytic plating are formed corresponds to the back surface adapted to be soldered to a printed circuit board. Instead of aforementioned lead-in wires, linear electrode patterns for electrolytic plating may be formed along boundaries between different areas.

The second step (2) above may be carried out by immersing the substrate in a plating tank and connecting the aforementioned electrodes for electrolytic plating to a negative electrode of the plating tank to apply a specified voltage. The negative voltage thus applied is communicated through the passages formed through the substrate to the electrode patterns on the opposite surface where semiconductor chips are mounted. Thus, metal films can be formed by this electrolytic plating process not only on the electrode patterns on the surface where the lead-in patterns are formed but also on the electrode patterns on the opposite surface with the semiconductor chips.

The third, fourth and fifth steps (3), (4) and (5) are similar to those in prior art methods of production, say, as shown in FIG. 8. Carrying out Steps (1)-(5) described above sequentially can produce semiconductor packages of this invention.

According to a preferred embodiment of the invention, following steps A, B and C are carried between the processes of aforementioned steps (2) and (3), or after the process of Step (2) is done and before the process of Step (3) is carried out. Step A is for obtaining an image of the surface of the substrate where the electrodes for electrolytic plating are not formed (or on which semiconductor chips are mounted). This may be done by placing the substrate on a flat surface with the surface having the semiconductor chips mounted thereon facing upward and placing a camera thereabove. Step B is for extracting a color corresponding to the formed metal films from the image obtained in Step A. If it was an electrolytic gold plating process that was carried out in Step (2), golden-colored areas are extracted from the image. Step C is for judging whether the electrolytic plating process has been carried out properly or not, based on the result of the extraction in Step B. This may be carried out by comparing the pattern represented by the area extracted in Step B with a preliminarily registered pattern (representing a proper pattern of a semiconductor chip on the mounting surface), The comparison may be made by carrying out a correlation matching process to obtain a degree of similarity between the two patterns or by binarizing the result of extraction in Step B and carrying out a differential calculation between this binarized image and the image shown by the registered pattern to extract the degree of difference between the patterns. This method of carrying out Steps A, B and C makes it possible, before semiconductor chips are mounted onto a substrate on which the electrolytic plating process has been carried out, to determine by a method of image processing whether the electrolytic plating process has been carried out properly or not. If it is determined that the electrolytic plating process has been carried out properly, it may then be concluded that one can safely proceed to aforementioned Step (3) because it may also be concluded that the connections through the passages through the substrate are properly established. In summary, the advantage of carrying out aforementioned Steps A, B and C is that not only the properness of the electrolytic plating process but also the electrically conducting conditions of the passages across the substrate can be simultaneously checked.

DETAILED DESCRIPTION OF THE INVENTION

Figure 1A:
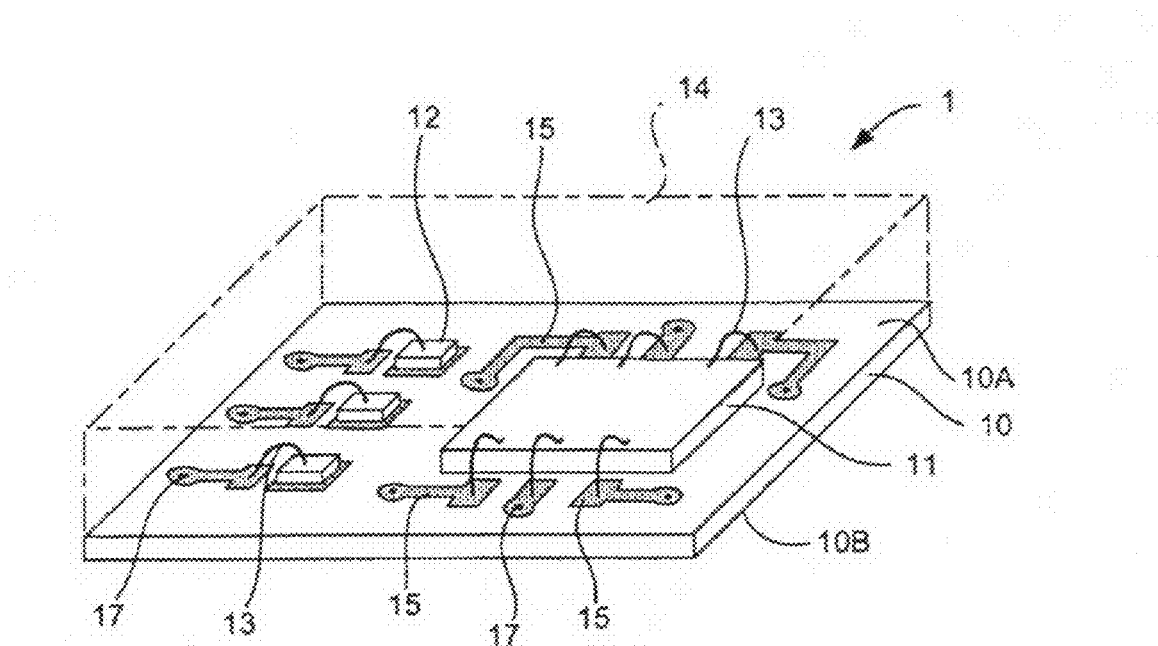
FIGS. 1A and 1B, together referred to as FIG. 1, are views of a semiconductor package embodying this invention taken diagonally from above and below, respectively.
Figure 1B:
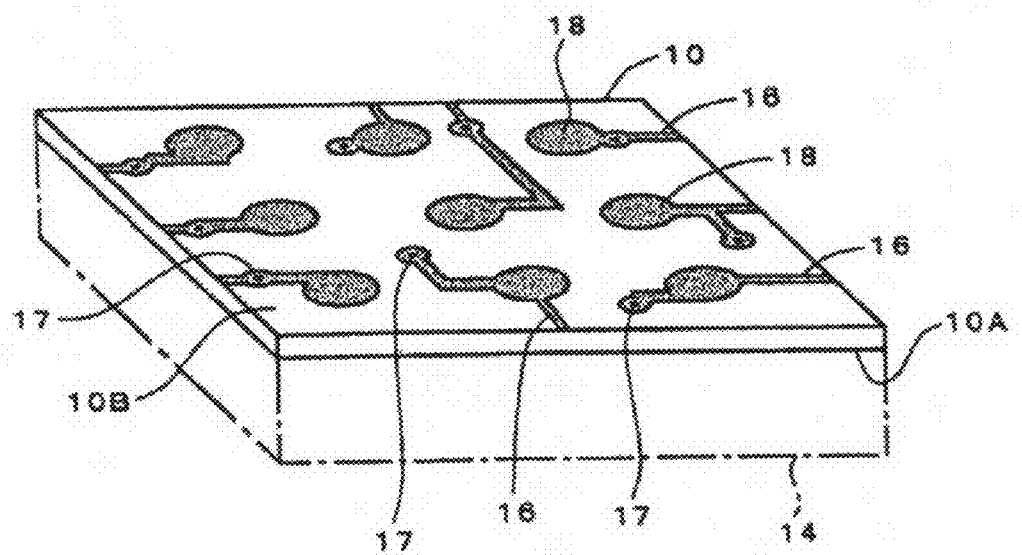

FIGS. 1A and 1B show a semiconductor package 1 embodying this invention, comprising a substrate 10 having electrode patterns 15 and 18 formed on both its surfaces and a plurality of semiconductor chips 11 and 12 mounted to one of its surfaces (hereinafter referred to as the mounting surface 10A) which is sealed by a transparent resin material 14. For the convenience of disclosure, FIG. 1 shows the transparent resin material 14 by broken lines, FIGS. 1A and 1B respectively showing its diagonal view from above and below.

The electrode patterns 15 (also referred to as wire-bonding electrode patterns) are formed on the mounting surface 10A for connecting to the semiconductor chips 11 and 12. The electrode patterns 18 (also referred to as connector electrode patterns) are formed on the opposite surface (hereinafter referred to as the back surface 10B) for connecting to a printed circuit board. Lead-in wires 16 (also referred to as lead-in patterns) for electrolytic gold plating are formed continuously from these electrode patterns 18. One end part of each of these lead-in wires 16 reaches an edge of the back surface 10B.

Figure 2:
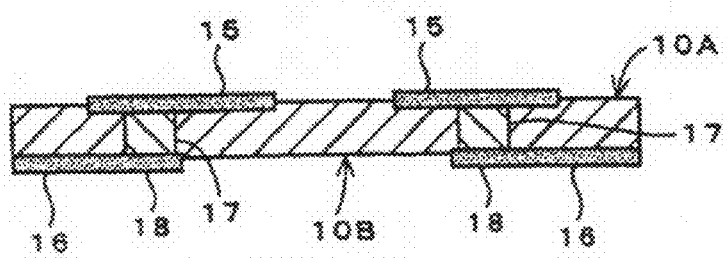
FIG. 2 is a sectional view of the package for showing the electrical connection between electrode patterns on both surfaces.

The substrate 10 is further provided with a plurality of throughholes 17 in the direction of its thickness, formed as shown in FIG. 2 so as to electrically connect one of the electrode patterns 15 on the mounting surface 10A with another electrode pattern 18 on the back surface 10B.

Figure 3:
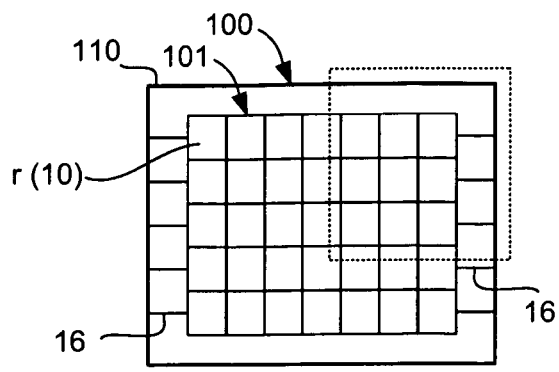
FIG. 3 is a schematic drawing for showing the structure of a assembly substrate.

The substrate 10 that is now incorporated in the semiconductor package 1 was originally one of the areas r into which was divided an assembly substrate 100 as shown in FIG. 3. As shown in FIG. 3, an effective area 101 was defined on this assembly substrate 100, exclusive of edge portions of a certain width, and this effective area 101 was divided into a plurality of areas r, mutually adjacent ones of these areas r being connected electrically through the lead-in wires 16. The assembly substrate 100 is further provided with a frame 110 of an electrically conductive material on its edges and lead-in wires 16 from the areas r on the right-hand and left-hand edges are each extended so as to connect to the frame 110.

Figure 4A:
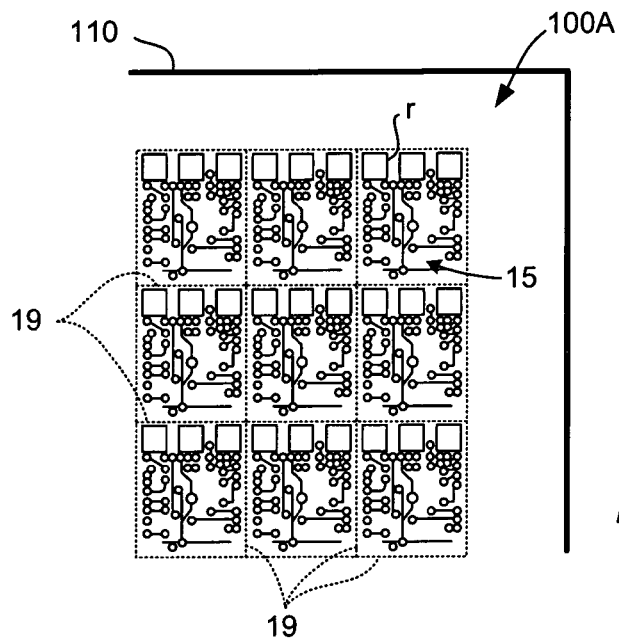
FIGS. 4A and 4B, together referred to as FIG. 4, show electrode patterns on the mounting and back surfaces of the assembly substrate.
Figure 4B:
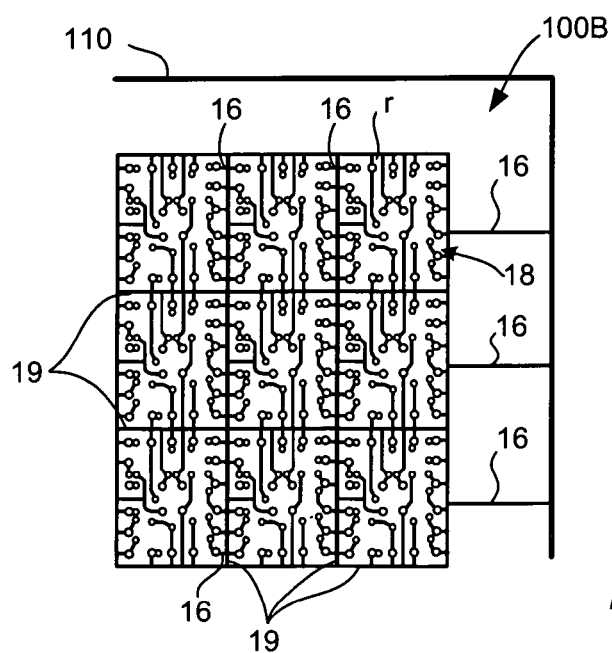

The electrode patterns on the mounting back surfaces 100A and 100B of the assembly substrate 100 are illustrated enlarged in detail in FIGS. 4A and 4B, respectively. As shown, each surface has a same pattern 15 or 18 formed repeatedly in each of the areas r.

The back surface 100B has the lead-in wires 16 for connecting between the areas r and boundary lines 19 between the areas r are formed thereon as a conductive pattern by using a material similar to the electrode patterns 18. The lead-in wires 16 between the areas r are formed perpendicularly to the boundary lines 19. Each electrode pattern 18 is connected to either a lead-in wire 16 or a boundary line 19. Thus, each electrode pattern 18 inside an area r is either directly or indirectly connected to a lead-in wire 16.

By contrast, neither the lead-in wires 16 nor the boundary lines 19 are formed on the mounting surface 100A, and each electrode pattern 15 within an area r is in an electrically independent condition. Boundaries between the areas r are shown in FIG. 4A by broken line merely for the convenience of illustration. Each electrode pattern 15, however, is electrically connected to the corresponding one of the electrode patterns 18 on the back surface 100B through the throughholes 17 (not shown in FIG. 4).

For carrying out an electrolytic gold plating process on the assembly substrate 100 structured as described above, the assembly substrate 100 is immersed in a plating tank and a negative voltage is applied to the frame 100 or a lead-in wire 16 connected thereto. The negative voltage thus applied is transmitted through the throughholes 17 to the electrode patterns 15 on the mounting surface 100A. As a result, gold ions inside the plating tank come to be attached not only to the electrode patterns 18 on the back surface 100B but also to the electrode patterns 15 on the mounting surface 100A such that a gold film is formed on all of electrode patterns on the assembly substrate 100.

Figure 5:
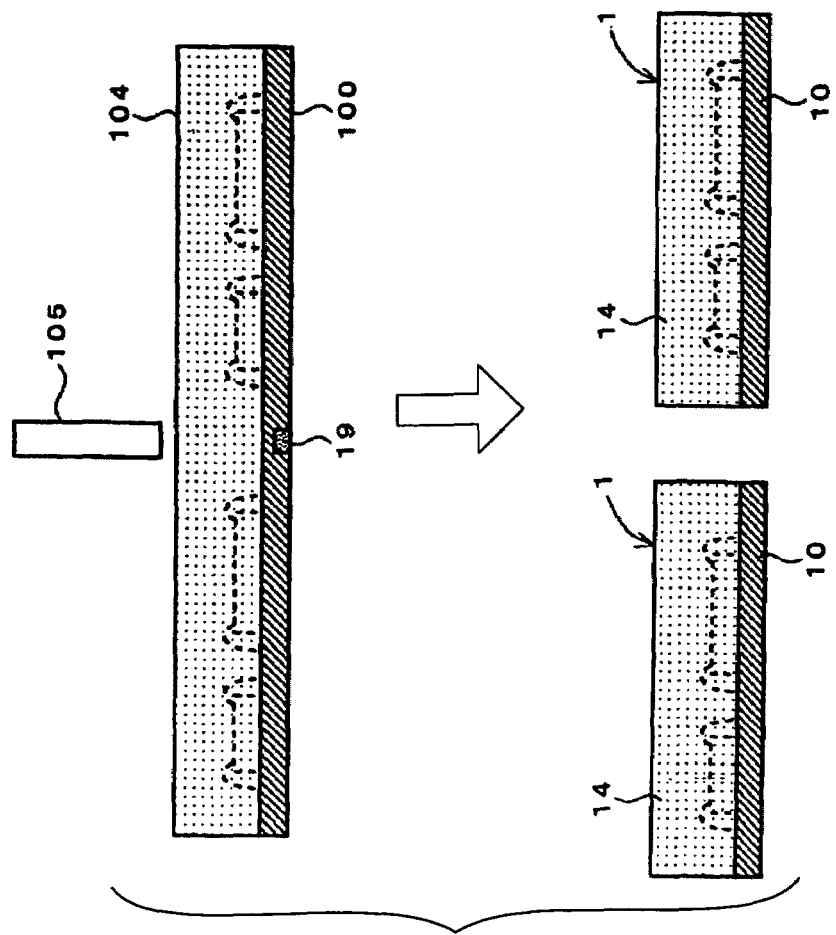
FIG. 5 is a drawing for shown how the contour line on the assembly substrate is removed by dicing.
Figure 8:
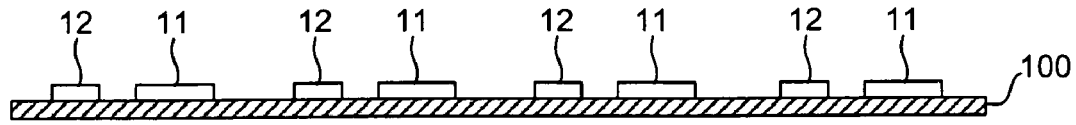
FIG. 8 is a diagram for showing a prior method of producing semiconductor packages.
Figure 8:
Figure 8:
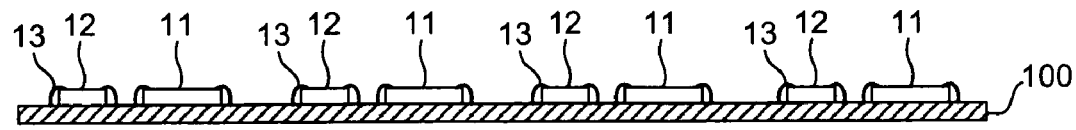
Figure 8:
Figure 8:
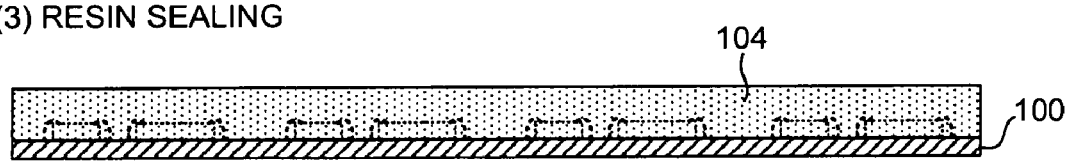
Figure 8:
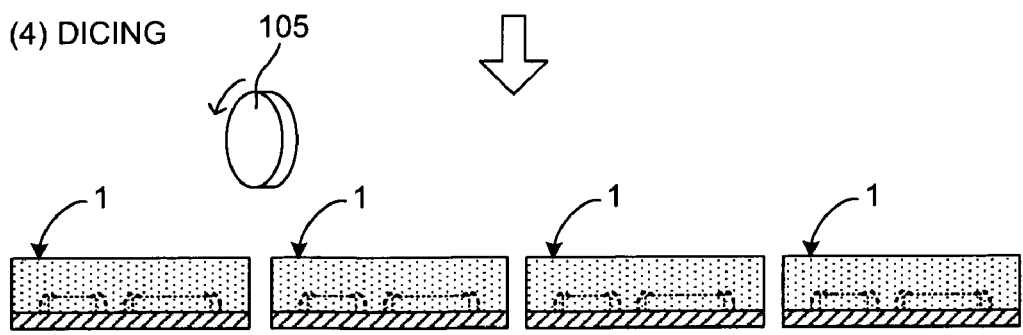
Figure 9:
FIGS. 9A, 9B and 9C, together referred to as FIG. 9, are schematic drawings for showing a method mounting semiconductor packages onto a printed circuit board.
Figure 9:
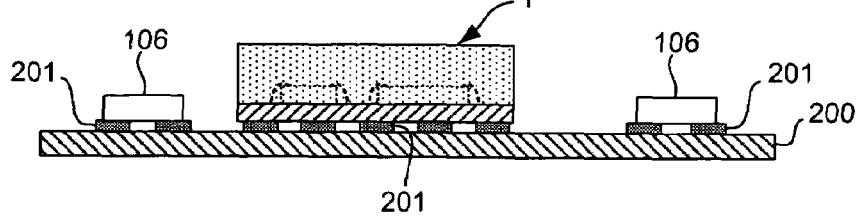
Figure 9:
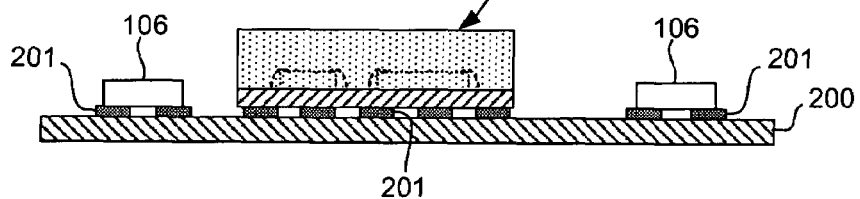
Figure 10:
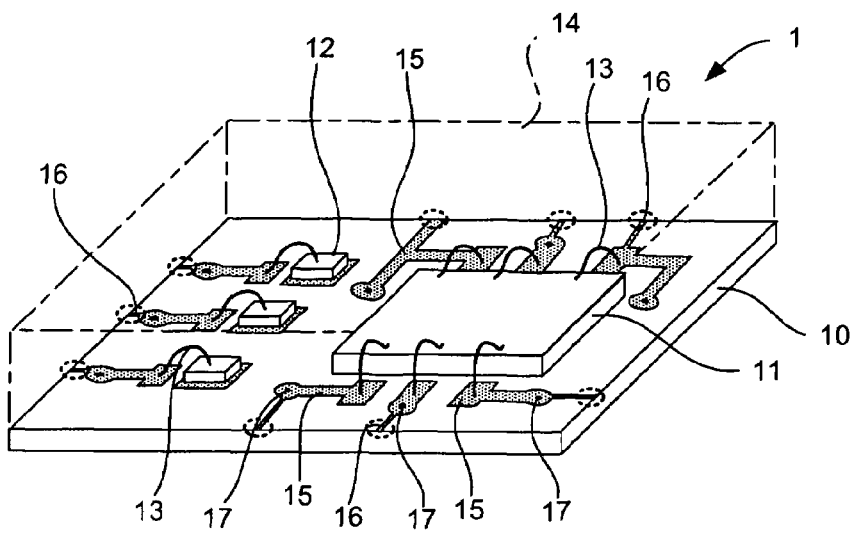
FIG. 10 is a diagonal view of a prior art semiconductor package.

After the electrolytic gold plating process is completed, processes similar to those shown in FIG. 8 such as die bonding, wire bonding, resin sealing and dicing processes are carried out to complete the production of packages 1 as shown in FIG. 1. The dicing process is carried out along the boundary lines between the areas 5, and since the dicing blade 105 is broader than the width of the boundary lines 19, as shown in FIG. 5, the boundary lines 19 are eliminated as the substrate 100 is cut. Since the lead-in wires 16 formed across the boundary lines 19 are cut into two parts by this operation, the lead-in wires 16 end up having an exposed end part on edge parts of individual substrates 10, as shown in FIG. 1B.

By a production method as described above, since no lead-in wires for electrolytic gold plating are formed on the mounting surface 100A, there is no electrode pattern sandwiched between the substrate 10 and the sealing resin 14 and exposed at any edge surface of the package after the dicing process and hence the resin 14 and the substrate 10 can be attached strongly to each other. Thus, the increase in the hygroscopic property of the package 1 can be prevented without mixing in any additive and the occurrence of a failure and destruction of the package 1 at the time of reflow can be prevented. Moreover, since a suitable electrolytic gold plating process can be carried out on the electrode patterns 15 on the mounting surface 100A merely by applying a suitable voltage through the throughholes 17, the strength of the wire bonding can be dependably assured.

The back surface 10B is directly attached to a printed circuit board without being sealed with resin but since no electrode is formed and no cream solder is applied at a place contacting the lead-in wire 16 on the side of the printed circuit board, there is no problem of poor connection as long as the package 1 properly mounted.

If a photo IC or a light-emitting diode is incorporated into the semiconductor package 1 structured as described above, however, it is necessary that the sealing resin be transparent in order to allow light to pass through. The method of this invention as described above is advantageous because the hygroscopic property of the package 1 can be prevented from increasing without using any additive and the strength of wire bonding can also be assured.

Figure 6:
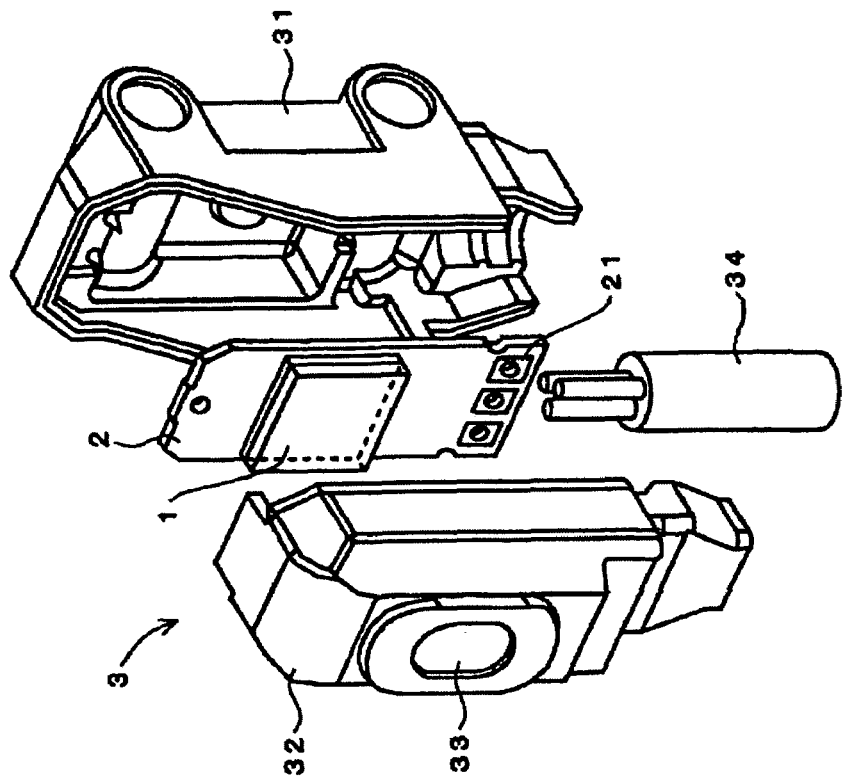
FIG. 6 is an exploded diagonal view of a light receiving device incorporating a semiconductor package.

FIG. 6 shows an example of light receiving device 3 incorporating a semiconductor package 1 containing a photo IC as described above. This light receiving device 3 has a main body comprised of a case structure 31 with its front part opened and a cover 32 that is adapted to be inserted to this opening of the case structure 31. For assembling this light receiving device 3, a printed circuit board 2 having a semiconductor package 1 mounted thereto is set inside the case structure 31 and a cable 34 is soldered to a terminal 21 on this printed circuit board 2. Thereafter, the cover 32 in inserted into the case structure 31 and fixed by means of a screw (not shown) or the like. The cover 32 is provided with a transparent window 33, the position of which is determined so as to be opposite to and facing the photo IC inside the semiconductor package 1 on the printed circuit board 2.

Since the electrolytic gold plating process is an important process from the point of view of securing the strength of the wire bonding, it is preferable to ascertain before the semiconductor package 1 is mounted whether or not this electrolytic gold plating process has been carried out correctly.

The aforementioned throughholes 17 are provided not only for the purpose of the electrolytic gold plating process but also for serving to connect the semiconductor chips 11 and 12 with the printed circuit board 2 as well as the electrode patterns 15 and 18 on both surfaces. Thus, it is preferable also to ascertain before the semiconductor package 1 is mounted whether or not these throughholes 17 are properly serving their purposes of conduction.

Figure 7A:
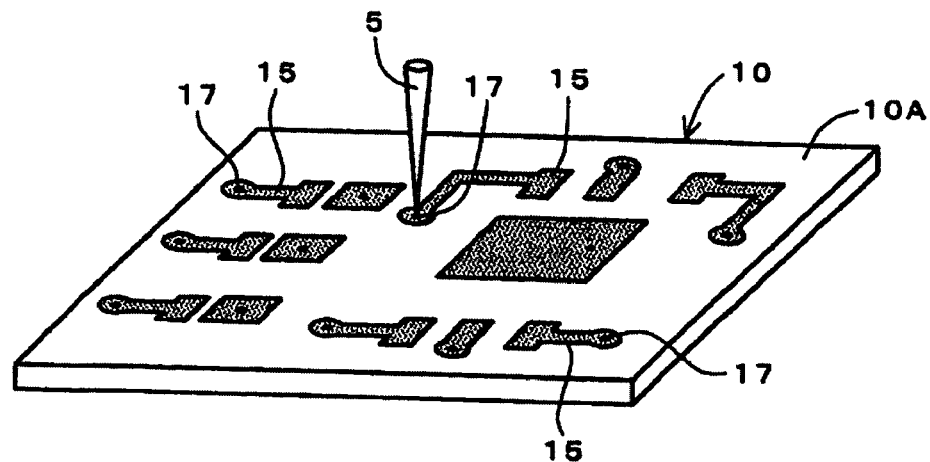
FIG. 7A is a schematic diagonal view showing a prior art method of inspecting a semiconductor package and FIG. 7B is a schematic diagonal view showing a method of this invention for inspecting a semiconductor package.

According to a conventional method, as shown in FIG. 7A, a probe 5 was employed to check the conditions of the throughholes 17 sequentially. According to another conventional method, an inspection device having a plurality of pins corresponding to all of the throughholes 17 was used to check the conditions of all throughholes at the same time. The former method is time-consuming because the probe 5 must be moved to the positions of the throughholes 17 sequentially to repeat a same checking operation. The latter method is not effective cost-wise because a dedicated inspection device must be prepared for each kind of substrate and hence the production efficiency is adversely affected. Moreover, these methods are merely for checking the conducting conditions of the throughholes 17. Neither of these methods can be used for checking whether the electrolytic gold plating process has been carried out properly or not.

Figure 7B:
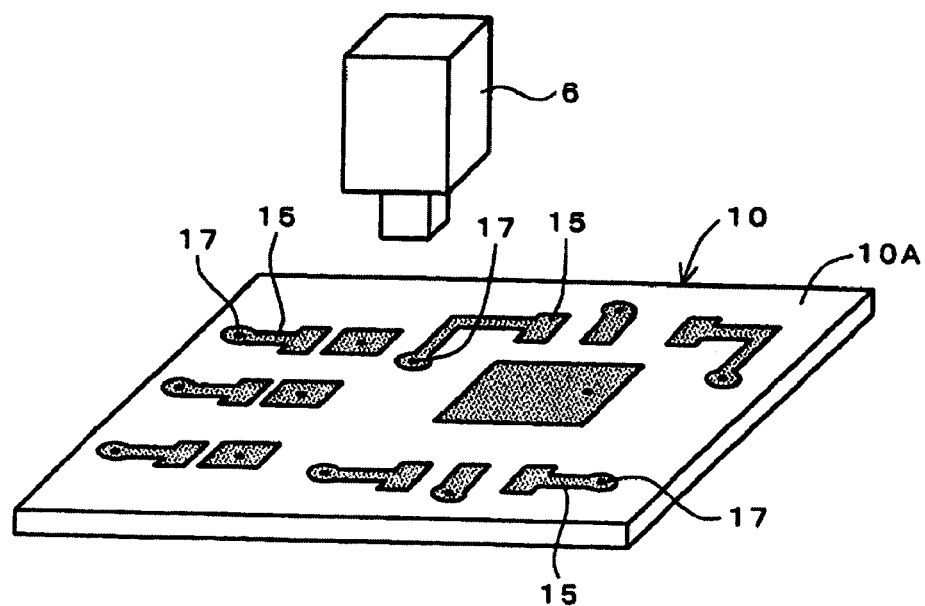

When a substrate 10 with lead-in wires 16 for electrolytic gold plating formed on its back surface 10B as shown in FIG. 1B is to be produced, a camera 6 may be used as shown in FIG. 7B to obtain an image of its mounting surface 10A and the image thus obtained may be inputted to a computer for checking the appropriateness of the electrolytic gold plating process carried out thereon and the conductive conditions of its throughholes 17 at the same time. This is so because if the conductive conditions of the throughholes 17 are good, it may be concluded that the electrolytic gold process can be carried out properly and the same gold-colored pattern can be obtained as the electrode patterns on the mounting surface 10A. Thus, a gold-colored pattern may be extracted from the image obtained by the camera 6 and compared with a preliminarily registered electrode pattern of the substrate. If they match, it may be concluded that both the electrolytic gold plating and the conductive conditions of the throughholes 17 are both proper. If the extracted pattern and the preliminarily registered pattern have non-matching portion, it may be concluded that the electrolytic gold plating process has not been appropriately carried out and also that the conductive conditions of the throughholes 17 are less than perfect.

This method with the use of a camera 6 is advantageous because the image-taking process by the camera 6 is carried out only once to obtain an image which is sufficient for determining appropriateness of the conductive conditions of all throughholes 17 are proper, as well as that of the electrolytic gold plating process. Thus, this invention contributes to an improved production efficiency.

What is claimed is:

1. A semiconductor package for surface mounting, said semiconductor package comprising;
   a substrate having a mounting surface and a back surface facing opposite to each other, wire-bonding electrode patterns for wire-bonding being formed exclusively and directly on said mounting surface and connector electrode patterns and lead-in patterns for electrolytic plating being formed exclusively and directly on said back surface, said lead-in patterns being connected to said connector electrode patterns and reaching an edge part of said substrate;
   semiconductor chips that are wire-bonded on said mounting surface; and
   a resin layer that seals said mounting surface so as to seal in said wire-bonding electrode patterns;
   wherein said mounting surface has no lead-in pattern formed thereon to reach an edge part of said substrate;
   wherein said substrate is provided with passages through which the wire-bonding and connector electrode patterns placed correspondingly opposite to each other with respect to said substrate on said mounting surface and said back surface are electrically connected; and
   wherein said wire-bonding and connector electrode patterns each have a metal film that is formed by an electrolytic plating process.

2. The semiconductor package of claim 1 wherein each of said lead-in patterns has an externally exposed end part.

3. The semiconductor package of claim 2 wherein said resin layer comprises a transparent resin.

4. The semiconductor package of claim 1 wherein said resin layer comprises a transparent resin.

5. The semiconductor package of claim 1 wherein said back surface is not covered with any resin layer.

6. The semiconductor package of claim 5 wherein each of said lead-in patterns has an externally exposed end part.

7. The semiconductor package of claim 6 wherein said resin layer comprises a transparent resin.

8. The semiconductor package of claim 5 wherein said resin layer comprises a transparent resin.

9. A method of producing semiconductor packages for surface mounting, said method comprising the steps of:

preparing a substrate having a mounting surface and a back surface facing opposite to each other, a plurality of areas corresponding to the size of said semiconductor packages set on said substrate;

forming wire-bonding electrode patterns for wire-bonding exclusively and directly on said mounting surface such that the electrode patterns formed in different ones of said areas are electrically independent to each other and separate from edge parts of said areas;

forming connector electrode patterns and lead-in patterns for electrolytic plating exclusively and directly on said back surface between mutually adjacent ones of said areas such that electrode patterns on different ones of said areas are electrically connected through said lead-in patterns;

forming in each of said areas passages through which the electrode patterns placed correspondingly opposite to each other with respect to said substrate on said mounting surface and said back surface are electrically connected;

applying a specified voltage to said lead-in patterns and thereby forming a metal film over the electrode patterns on both said mounting surface and said back surface by an electrolytic plating process;

thereafter placing and wire-bonding semiconductor chips onto said mounting surface, there being no lead-in patterns formed on said mounting surface to reach an edge part of the substrate;

thereafter sealing said mounting surface with a resin; and thereafter separating said substrates into said areas.

10. The method of claim 9 further comprising the steps, after the step of forming the metal film and before the step of wire-bonding, of:

obtaining an image of said mounting surface on which no lead-in patterns are formed;

extracting from said image a color corresponding to said metal film; and checking whether said electrolytic plating process has been properly carried out based on results of the step of extracting the color.

11. The method of claim 10 wherein said back surface is not covered with any resin layer.

12. The method of claim 9 wherein said back surface is not covered with any resin layer.

* * * * *